US012782832B2

(12) United States Patent
Chiu et al.

(10) Patent No.: US 12,782,832 B2
(45) Date of Patent: Nov. 3, 2026

(54) WAFER STAGE LIFTING SYSTEM AND METHOD FOR RAISING A WAFER STAGE

(71) Applicant: LIDS SEMICONDUCTOR TECHNOLOGY CO., LTD., Taichung City (TW)

(72) Inventors: Chun-Jung Chiu, Taichung City (TW); Chun-Hsiung Chen, Taichung City (TW); Wen-Tung Yang, Taichung City (TW)

(73) Assignee: LIDS SEMICONDUCTOR TECHNOLOGY CO., LTD., Taichung City (TW)

( * ) Notice: Subject to any disclaimer, the term of this patent is extended or adjusted under 35 U.S.C. 154(b) by 69 days.

(21) Appl. No.: 19/078,510

(22) Filed: Mar. 13, 2025

(65) Prior Publication Data

US 2025/0314976 A1 Oct. 9, 2025

(30) Foreign Application Priority Data

Apr. 8, 2024 (TW) ................................ 113112985

(51) Int. Cl.

| | |
|---|---|
| ***G03F 7/00*** | (2006.01) |
| ***G01B 11/06*** | (2006.01) |
| ***G01B 11/16*** | (2006.01) |

(52) U.S. Cl.

CPC ...... *G03F 7/70725* (2013.01); *G01B 11/0608* (2013.01); *G01B 11/167* (2013.01);
(Continued)

(58) Field of Classification Search

CPC ............... G03F 7/7035; G03F 7/70783; G03F 7/70525; G03F 7/70725; G03F 7/70758;
(Continued)

(56) References Cited

U.S. PATENT DOCUMENTS 5,959,304 A * 9/1999 Tokita .................. G03F 7/7035 378/34
6,232,023 B1 * 5/2001 Matsuki ................ G03F 7/7035 430/311
(Continued)

FOREIGN PATENT DOCUMENTS

JP 2936920 B2 * 8/1999
JP 2018055051 A * 4/2018
(Continued)

OTHER PUBLICATIONS

Machine translation of JP-2936920-B2 (Year: 1999).*
(Continued)

*Primary Examiner* — Steven H Whitesell
(74) *Attorney, Agent, or Firm* — Bruce Stone LLP; Joseph A. Bruce

(57) ABSTRACT

The present invention relates to a system and method for precisely aligning a wafer and a photomask in a semiconductor lithography process. The system includes a wafer stage, a photomask stage, multiple linear actuators and distance sensors, and a controller. The wafer stage is configured to carry a wafer; the photomask stage is configured to carry a photomask. The linear actuators are used to adjust the wafer stage, and the distance sensors measure the height of the wafer surface. The controller is configured to measure the height at multiple points on the wafer surface, adjust its level, calculate the distance between the wafer and the photomask, and raise the wafer stage so that the wafer contacts the photomask. The present invention provides a semiconductor manufacturing method with improved accuracy, efficiency, and user control.

8 Claims, 9 Drawing Sheets

(52) U.S. Cl.
CPC ........ *G03F 7/7035* (2013.01); *G03F 7/70525* (2013.01); *G03F 7/70758* (2013.01); *G03F 7/70775* (2013.01); *G03F 7/70783* (2013.01)

(58) Field of Classification Search
CPC . G03F 7/70775; G03F 9/7034; G01B 11/167; G01B 11/0608
See application file for complete search history.

(56) References Cited

U.S. PATENT DOCUMENTS

| | | | | |
|---|---|---|---|---|
| 6,459,474 | B1 * | 10/2002 | Okada | H05K 3/0082 355/75 |
| 10,289,010 | B2 | 5/2019 | Shibazaki | |
| 11,029,612 | B2 | 6/2021 | Kimman et al. | |
| 2002/0063221 | A1 * | 5/2002 | Li | B82Y 10/00 250/491.1 |
| 2005/0057752 | A1 * | 3/2005 | Inao | B82Y 10/00 356/400 |
| 2018/0174884 | A1 | 6/2018 | Ichinose | |
| 2018/0341188 | A1 * | 11/2018 | Reijnders | G03F 7/70641 |
| 2024/0248415 | A1 | 7/2024 | Shervin et al. | |

FOREIGN PATENT DOCUMENTS

| | | | | |
|---|---|---|---|---|
| TW | 201842604 | A | 9/2019 | |
| WO | WO-2006137396 | A1 * | 12/2006 | G03F 1/62 |
| WO | WO-2008139643 | A1 * | 11/2008 | H05K 3/0082 |

OTHER PUBLICATIONS

Machine translation of WO-2006137396-A1 (Year: 2006).*
Machine translation of WO-2008139643-A1 (Year: 2008).*
Machine translation of JP-2018055051-A (Year: 2018).*

* cited by examiner

WAFER STAGE LIFTING SYSTEM AND METHOD FOR RAISING A WAFER STAGE

TECHNICAL FIELD

The present invention generally relates to semiconductor manufacturing and, more specifically, to a system and method for raising a wafer stage in a contact lithography process.

BACKGROUND

Optical lithography is a critical step in semiconductor manufacturing, during which a pattern on a photomask is transferred onto a wafer coated with a photosensitive material. One lithography method is contact lithography, wherein the photomask and the wafer come into direct physical contact.

Conventional systems often use a spring-loading mechanism to raise the wafer stage and bring the wafer into contact with the photomask. While such a mechanism is simple and cost-effective, it has several limitations:

1. Limited Accuracy: Spring-loaded systems generally lack the fine control needed for accurate alignment between the wafer and photomask, which is crucial for high-resolution patterning.
2. Risk of Damage: The force exerted by springs can damage the sensitive surfaces of both the wafer and the photomask, adversely affecting device yield and quality.
3. Wear and Tear: Springs and other mechanical components wear out over time, requiring frequent maintenance and replacement.
4. Lack of Feedback: Conventional systems typically lack a real-time feedback mechanism to enable adjustments according to changes in the characteristics of the wafer or photomask.

Accordingly, there is a need for an improved system and method for raising a wafer stage in a contact lithography process to address these issues and limitations.

SUMMARY

In order to solve the aforementioned problems, the present invention provides a system and method for raising a wafer stage in a contact lithography process, overcoming the shortcomings and limitations of conventional spring-loading mechanisms. The wafer stage lifting system utilizes a wafer stage to carry a wafer, connected to at least three linear actuators responsible for its vertical movement. Positioned above the wafer stage are at least three distance sensors. Additionally, a photomask stage is provided for carrying a photomask, whose surface is used as the reference for height measurements.

A controller in the wafer stage lifting system of the present invention is configured to perform a series of steps aimed at achieving precise alignment between the wafer and the photomask. First, the controller measures the height of at least three points on the wafer surface by using the distance sensors. Based on these measurements, the controller adjusts the level of the wafer surface via the linear actuators. Next, the controller calculates the exact distance—for example, "D"—between the wafer surface and the photomask. The wafer stage is then raised by distance D so that the wafer makes accurate, planar contact with the photomask.

An important advantage of the present invention is that the use of linear actuators and distance sensors significantly enhances alignment accuracy between the wafer and photomask. This system not only minimizes the risk of damage to the wafer and photomask but also allows real-time adjustments through a feedback loop, thereby ensuring higher accuracy and repeatability. In addition, the invention includes a feature that triggers wafer replacement when the height difference among the measurement points exceeds a predetermined threshold, adding an extra layer of quality control to the overall lithography process.

By providing a more precise, reliable, and adaptable solution for raising the wafer stage in contact lithography, the present invention represents a significant advancement in the field of semiconductor manufacturing.

BRIEF DESCRIPTION OF THE DRAWINGS

The objects, spirits, and advantages of the preferred embodiments of the present disclosure will be readily understood by the accompanying drawings and detailed descriptions, wherein.

DETAILED DESCRIPTION

Figure 1A:
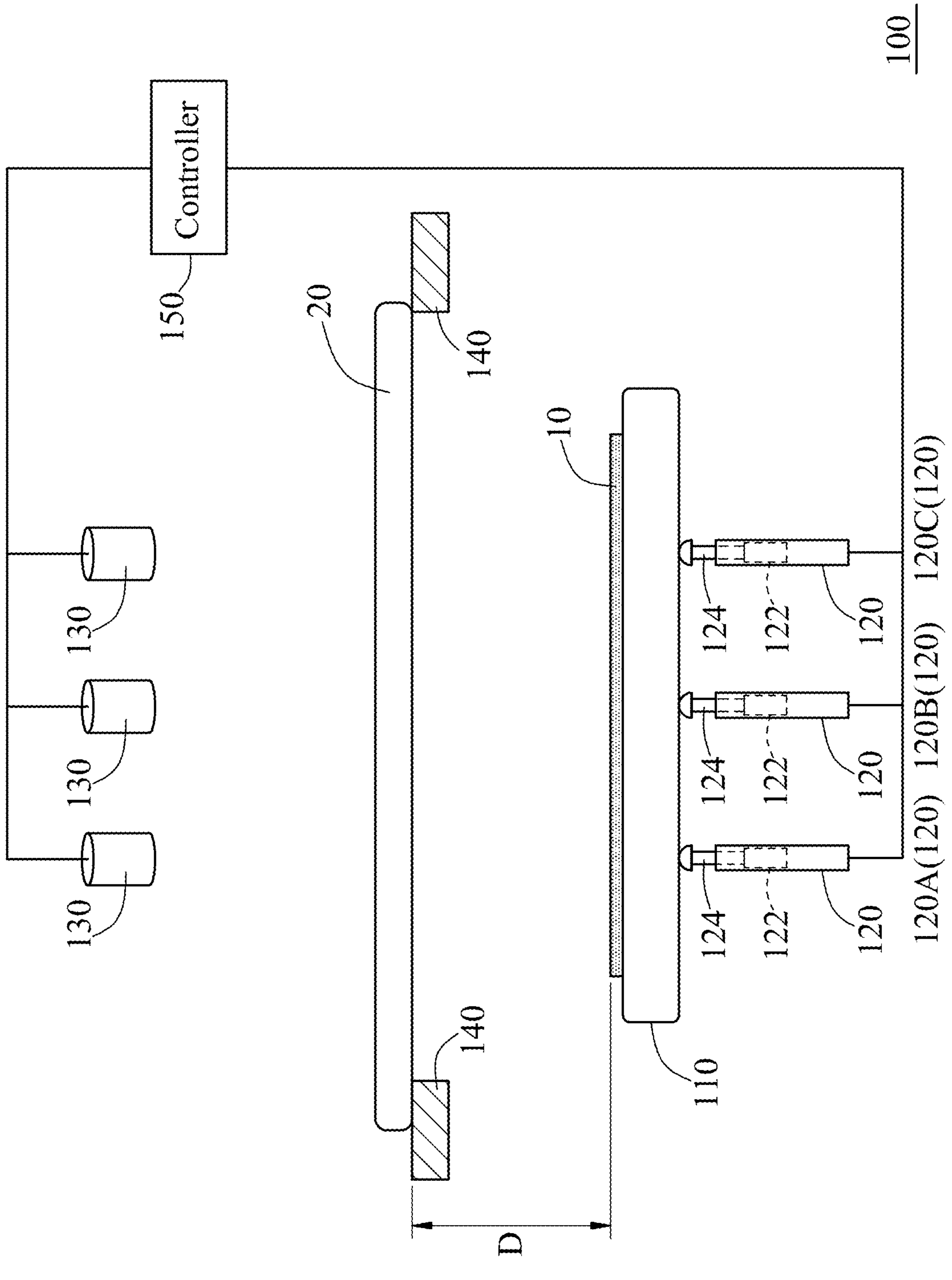
FIG. 1A is a schematic diagram illustrating one embodiment of the wafer stage lifting system according to the present invention.

Please refer to FIG. 1A, which is a schematic diagram of one embodiment of the wafer stage lifting system 100 according to the present invention. The wafer stage lifting system 100 includes a wafer stage 110 that is specifically designed to stably carry a wafer 10. The wafer stage 110 is typically made of materials with high rigidity and thermal stability, such as aluminum or ceramic composites, to ensure it maintains its shape and dimensions under various environmental conditions. Additionally, the surface of the wafer stage 110 is engineered to provide a high degree of flatness and is often coated with a non-reactive material to prevent any chemical reactions with the wafer 10, thus ensuring the wafer 10 remains uncontaminated throughout the process.

The wafer stage 110 may utilize various mechanisms to fix the wafer 10 in place, such as vacuum chucks, electrostatic chucks, or mechanical clamps. Vacuum chucks are commonly used because they can securely hold the wafer 10 without exerting excessive force that could damage it.

Vacuum is generated through a series of small holes (not shown) in the surface of the wafer stage 110, creating suction that holds the wafer 10 in position.

Furthermore, the wafer stage 110 is connected to a set of linear actuators 120 for vertical motion. In this embodiment, there are three linear actuators 120, respectively referred to as linear actuators 120A, 120B, and 120C. These linear actuators 120 provide precise control of the wafer 10's position relative to the photomask 20, in contrast to the limited fine control of conventional spring-loading mechanisms.

In this embodiment, the linear actuators 120 are driven by electricity, although other embodiments may use pneumatic or hydraulic drives. Electrically driven linear actuators are often preferred for their ease of control and integration with digital control systems. Each linear actuator (e.g., 120A, 120B, 120C) typically includes a motor 122 that drives a lead screw 124, enabling the extension or retraction of the lead screw 124 to produce linear motion. The motor 122 in each linear actuator can be a stepper motor or a servo motor, chosen based on the required speed and torque, and the screw drive can be a ball screw or a lead screw. In this embodiment, sensors (not shown) inside each linear actuator continuously monitor the position of the lead screw 124 and send this information to a controller 150. This allows the controller 150 to instantly adjust the positions of the linear actuators 120A, 120B, 120C, ensuring that the wafer stage 110 is lifted uniformly and aligned with the photomask 20 (detailed below). Note that the depiction of the linear actuators 120 and their lead screws 124 is schematic and not drawn to scale.

There are at least three linear actuators (three in this embodiment)—namely 120A, 120B, and 120C—arranged so that they are not collinear, typically in a triangular or polygonal configuration. These linear actuators 120A, 120B, 120C are pre-positioned such that each can raise or lower a different region of the wafer stage 110 to provide precise height adjustment in the horizontal plane, thereby ensuring uniform, planar contact between the wafer 10 and the photomask 20.

Figure 1B:
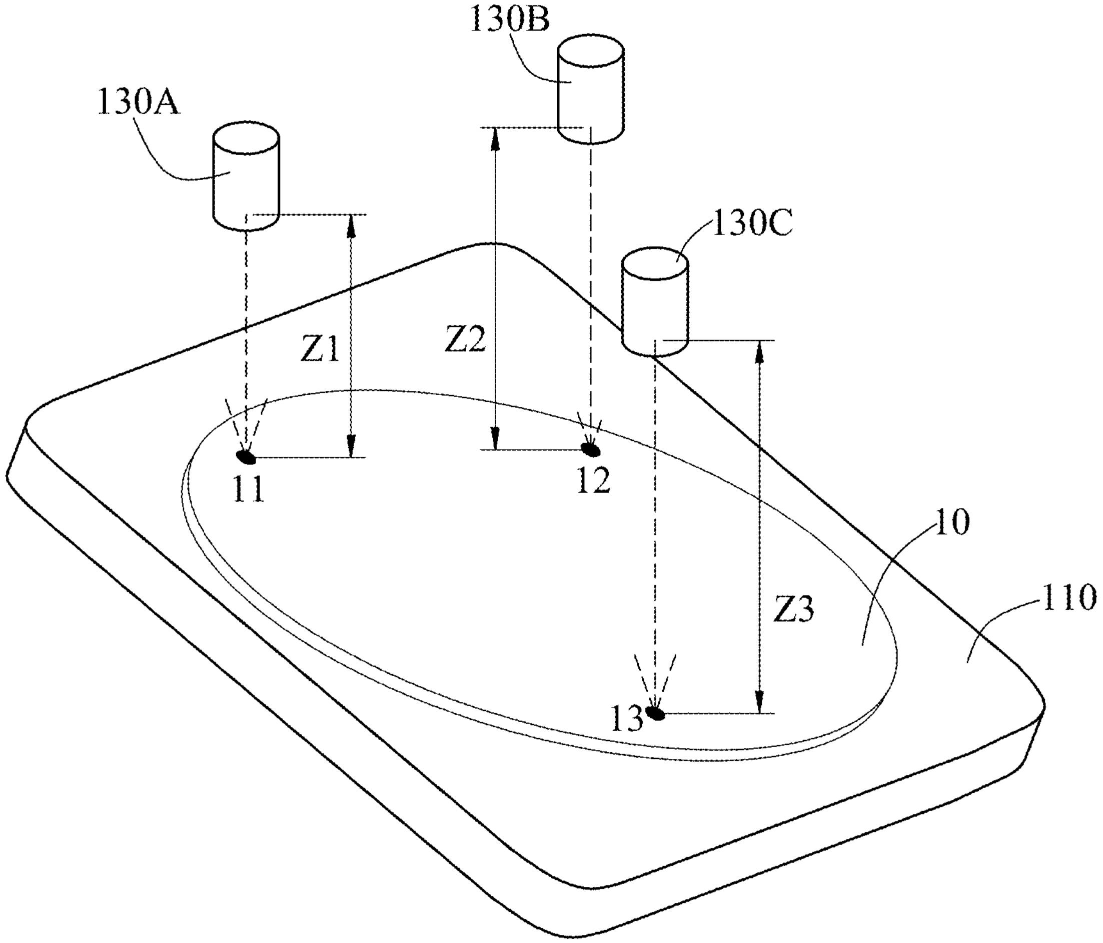
FIG. 1B is a perspective view showing three distance sensors respectively targeting three measurement points on a wafer.

Next, please also refer to FIG. 1B, which is a perspective view showing three distance sensors respectively aiming at three points on the wafer surface. Positioned above the wafer stage 110 is a set of at least three distance sensors 130 (in this embodiment, 130A, 130B, and 130C), which measure the height of the wafer 10 at multiple points. These distance sensors are arranged in a triangular or other polygonal configuration (triangular in this embodiment). The distance sensors 130 can be laser distance sensors, capacitive sensors, or any other type capable of providing accurate distance measurements. In this embodiment, laser distance sensors are used. The distance sensors 130 communicate with the controller 150, which processes the measurement data in real time. This data is used to calculate the exact distance between the wafer 10 surface and the photomask 20.

In this embodiment, the number of distance sensors 130 matches the number of linear actuators 120 and corresponds to their locations; for instance, distance sensors 130A, 130B, 130C are positioned above linear actuators 120A, 120B, 120C, respectively.

The distance sensors 130 work in coordination with a photomask stage 140 that carries the photomask 20. The spacing and level between the distance sensors 130 and the photomask stage 140 are pre-adjusted and calibrated so that the surface of the photomask stage 140 is horizontally level and serves as a reference plane. Typically, this reference plane is set to zero to facilitate the measurement of heights at various points on the wafer 10. Additionally, the horizontal level of the wafer stage 110 and its distance from the photomask stage 140 are also pre-calibrated.

Moreover, the wafer stage lifting system 100 further includes the controller 150, which controls the distance measurement by the distance sensors 130 and the raising/lowering action of the linear actuators 120, and also manages the calculations and overall operation of the wafer-lifting process.

Figure 2A:
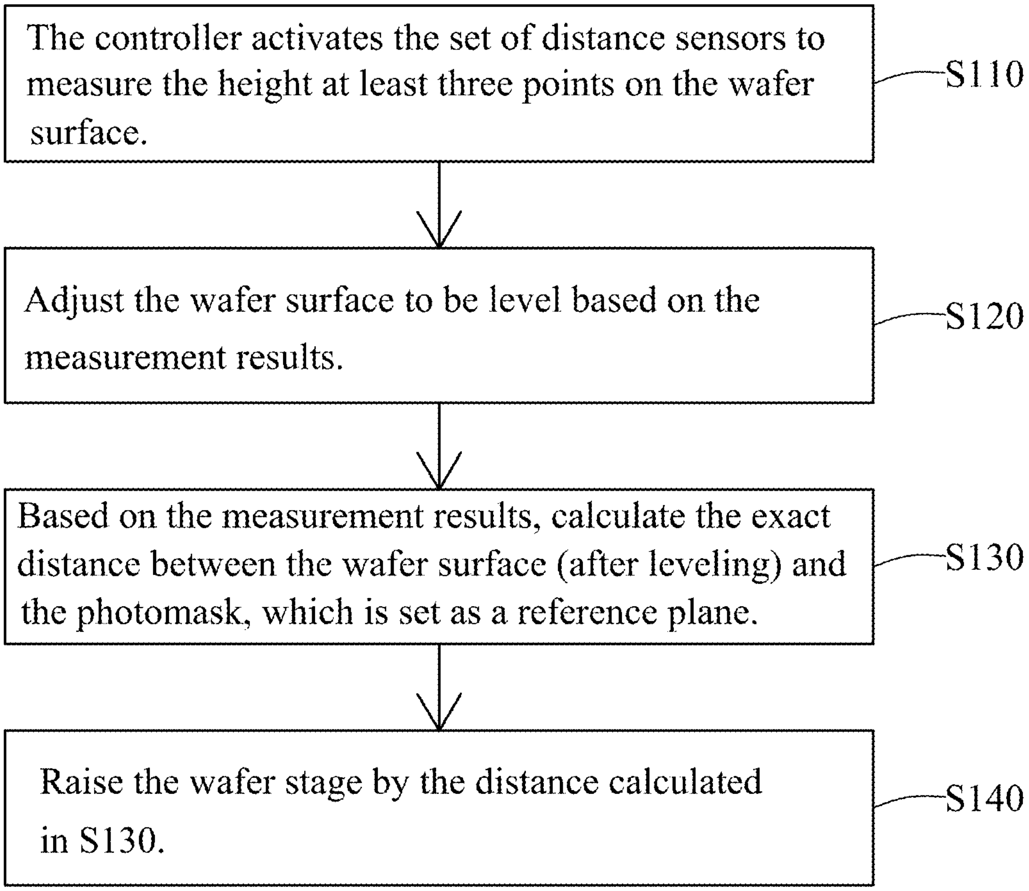
FIG. 2A is a flowchart illustrating one embodiment of the method for raising the wafer stage according to the present invention.

Please refer also to FIG. 2A, which is a flowchart illustrating one embodiment of the method for raising the wafer stage 110 according to the present invention. First, in step S110, the controller 150 activates the distance sensors 130 to measure at least three points on the wafer surface—e.g., measurement points 11, 12, and 13—using the three distance sensors 130A, 130B, and 130C, respectively. These points form a triangular arrangement in this embodiment. In other embodiments with more than three distance sensors 130, the measurement points may form a polygonal arrangement.

Figure 3A:
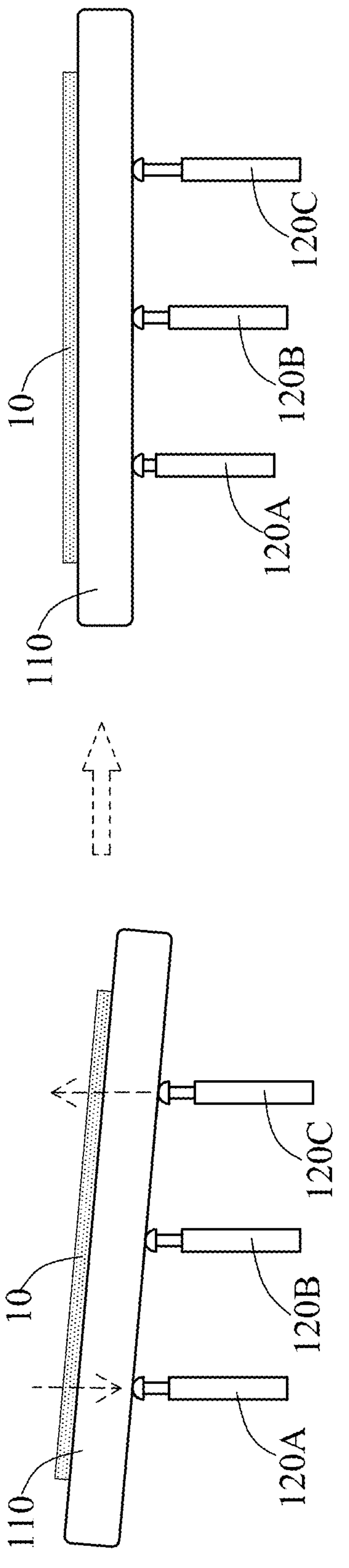
FIG. 3A is a diagram showing one embodiment of how the wafer stage is adjusted from a tilted state to a level state in the present invention.

Then, in step S120, based on these measurements, the controller 150 adjusts the level of the wafer surface. Referring to FIG. 1B as an example, the distances measured by sensors 130A, 130B, and 130C to points 11, 12, and 13 are Z1, Z2, and Z3, respectively. Adjustments are made so that Z1, Z2, and Z3 become approximately equal, ensuring the wafer surface is level. As shown in FIG. 3A, in step S120, the controller 150 operates the linear actuators 120A, 120B, and 120C to make the necessary adjustments so that Z1, Z2, and Z3 converge to equal values and the wafer surface becomes level.

After leveling the wafer surface, in step S130, the controller 150 again measures the wafer surface height and calculates the exact distance, for example "D," between the wafer surface (now level) and the reference plane of the photomask 20 (see FIG. 1A). In step S140, the wafer stage 110 is raised by the calculated distance D, bringing the wafer 10 into accurate, planar contact with the photomask 20.

Although, in the above embodiment, the controller 150 first levels the wafer surface (step S120) and then raises the wafer stage 110 (step S140), in other embodiments these operations can be performed simultaneously. Such synchronous operations may improve time and resource efficiency.

Figure 2B:
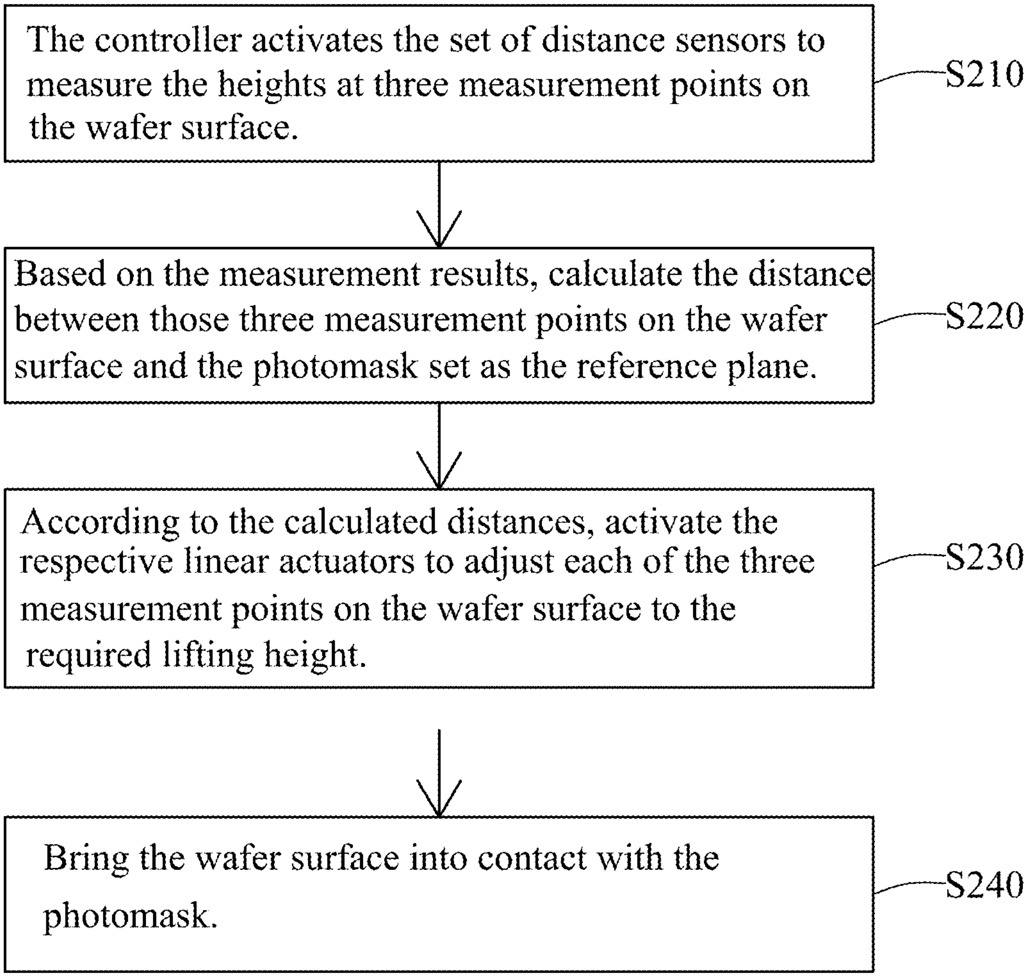
FIG. 2B is a flowchart illustrating another embodiment of the method for raising the wafer stage according to the present invention.

Please refer to FIG. 2B, which shows a flowchart of another embodiment of the method for raising the wafer stage according to the present invention. In step S210, the controller 150 activates the distance sensors 130 to measure at least three points on the wafer surface—e.g., measurement points 11, 12, and 13—identifying distances Z1, Z2, and Z3 between them and sensors 130A, 130B, and 130C, respectively.

Figure 3B:
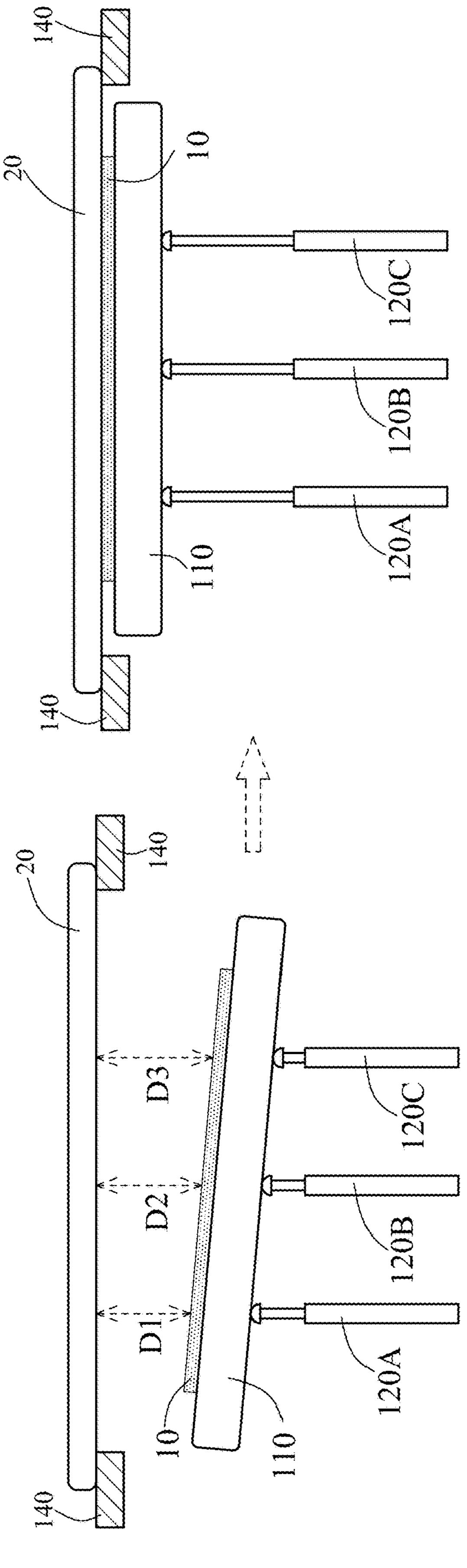
FIG. 3B is a diagram showing another embodiment of how the wafer stage is adjusted from a tilted state to a level state in the present invention.

Next, in step S220, the controller 150 calculates the distances D1, D2, and D3 between the wafer surface measurement points 11, 12, 13 and the photomask 20 (see FIG. 3B). Since the surface of the photomask stage 140 is predefined as level and set as the reference plane (zero point), and the distances between the distance sensors 130 and that zero point are known, once Z1, Z2, and Z3 are measured, D1, D2, and D3 can be computed. In step S230, the controller 150 operates the linear actuators 120A, 120B, and 120C to raise them by distances D1, D2, and D3, respectively. This action brings the wafer surface into contact with the photomask 20 (step S240), achieving both leveling and raising of the wafer 10 in one process.

Figure 2C:
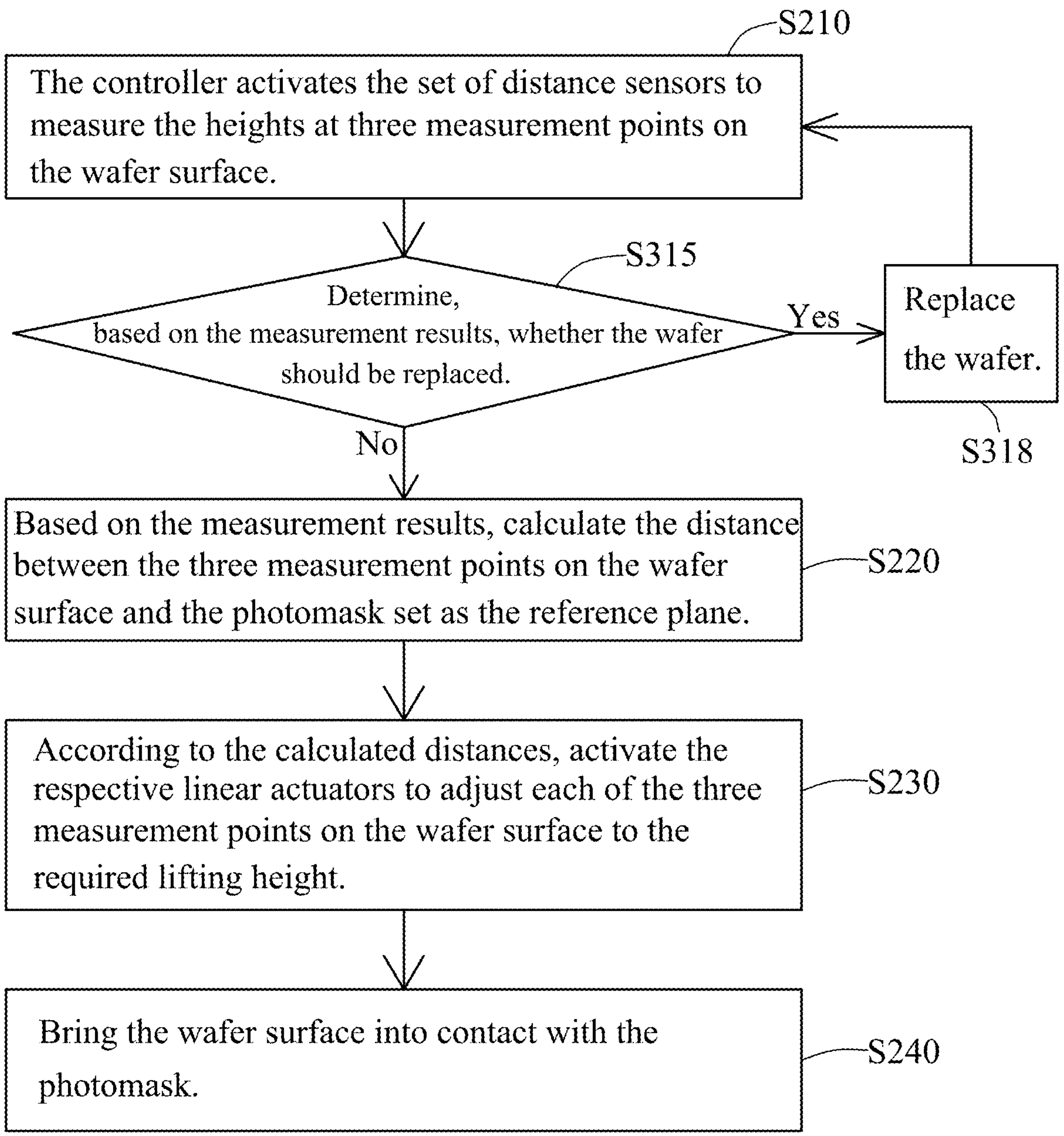
FIG. 2C is a flowchart illustrating yet another embodiment of the method for raising the wafer stage according to the present invention.

Please refer to FIG. 2C, which is a flowchart illustrating yet another embodiment of the method for raising the wafer stage. In this embodiment, the wafer stage 110 and the photomask stage 140 are included, and the controller 150 additionally executes step S315: determining whether the wafer 10 should be replaced based on height measurements taken at multiple points on the wafer surface. This step S315 helps maintain quality and integrity in the lithography process because a wafer with significant surface irregularities may lead to misalignment or other defects.

The controller 150 evaluates three height measurements from sensors 130A, 130B, and 130C at different positions on the wafer 10. These measurements are compared to assess the height variation across the wafer 10 surface. If the variation exceeds a predetermined threshold—indicating that the wafer surface flatness is outside the acceptable range—the controller 150 triggers a wafer replacement procedure. This threshold is generally determined based on empirical data and quality control standards: a threshold set too low may lead to frequent wafer replacements (increasing costs and reducing throughput), whereas a threshold set too high may compromise the quality of the final product. Once the controller 150 detects a variation exceeding the threshold, it proceeds to step S318, initiating a series of automated actions to replace the wafer 10. This may involve moving the wafer stage 110 out of its normal position and using a robotic arm (not shown) or other automated mechanism to remove the problematic wafer and replace it with a new one. The controller 150 may also log the event for quality control and traceability.

By identifying and replacing problematic wafers early in the process, step S315 helps avoid more costly downstream corrections and ensures that only wafers meeting quality standards proceed to subsequent manufacturing stages. In FIG. 2C, if the wafer 10 surface flatness is within the acceptable range, the process continues with adjusting the wafer surface height to contact the photomask, as shown by steps S220, S230, and S240 in FIG. 2B, which are omitted here for brevity.

Figure 2D:
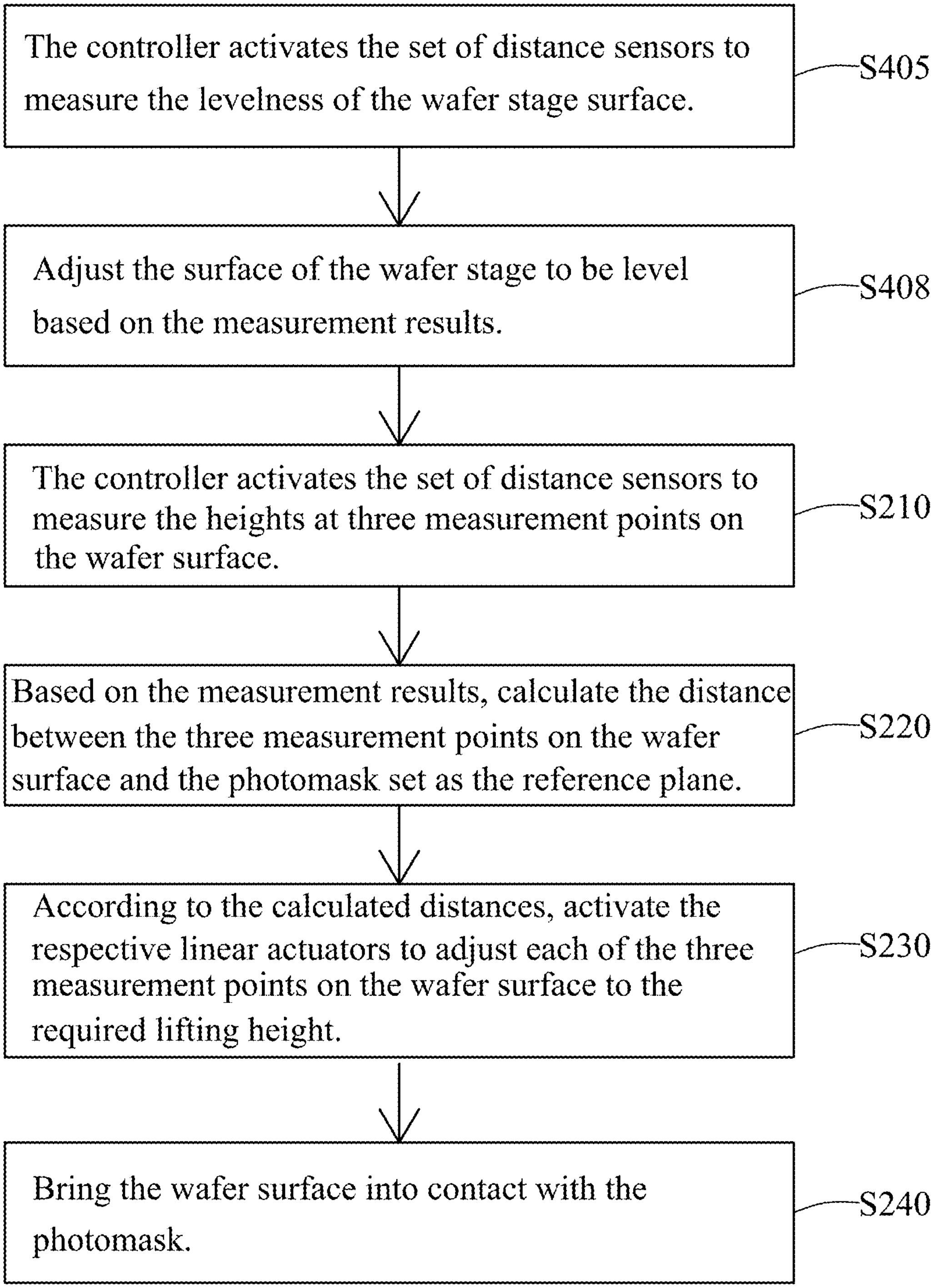
FIG. 2D is a flowchart illustrating still another embodiment of the method for raising the wafer stage according to the present invention.

Next, please refer to FIG. 2D, which is a flowchart illustrating still another embodiment of the method for raising the wafer stage. In this embodiment, the distance sensors 130 are also configured to measure the level of the wafer stage 110 surface first (step S405), further enhancing precision in the lithography process. The horizontal level of the wafer stage 110 serves as the foundational reference for all subsequent operations, including alignment with the photomask 20. In step S408, based on three measurements obtained from distance sensors 130A, 130B, and 130C, the controller 150 operates the corresponding linear actuators 120A, 120B, and 120C in the linear actuator set 120 to adjust the level of the wafer stage 110.

Steps S405 and S408 need not be performed each time the wafer stage 110 is raised; they are typically executed during the initial setup or after prolonged usage that may cause thermal drift or mechanical wear, in order to ensure that any potential deviation from level does not affect lithographic quality. In FIG. 2D, other steps mirror those in FIG. 2B and are not repeated for brevity.

In one embodiment, once the flatness of the wafer 10 surface is confirmed and height measurements are completed, the wafer stage lifting system 100 may retract the distance sensors 130 to avoid potential interference in subsequent lithography steps. In this embodiment, the distance sensors 130 are mounted on a precise retractable mechanism (not shown) driven by the controller 150. After the measurement cycle, the controller 150 activates the retraction mechanism to move the distance sensors 130 to a predetermined "safe position" (not shown), ensuring they do not obstruct the exposure area or introduce any form of contamination or optical interference during the sensitive lithographic exposure process. This safe position is carefully chosen to avoid interference with the lithography procedure. The retraction mechanism may involve a series of movements—vertical and lateral—to accommodate various lithography processes.

Figure 4:
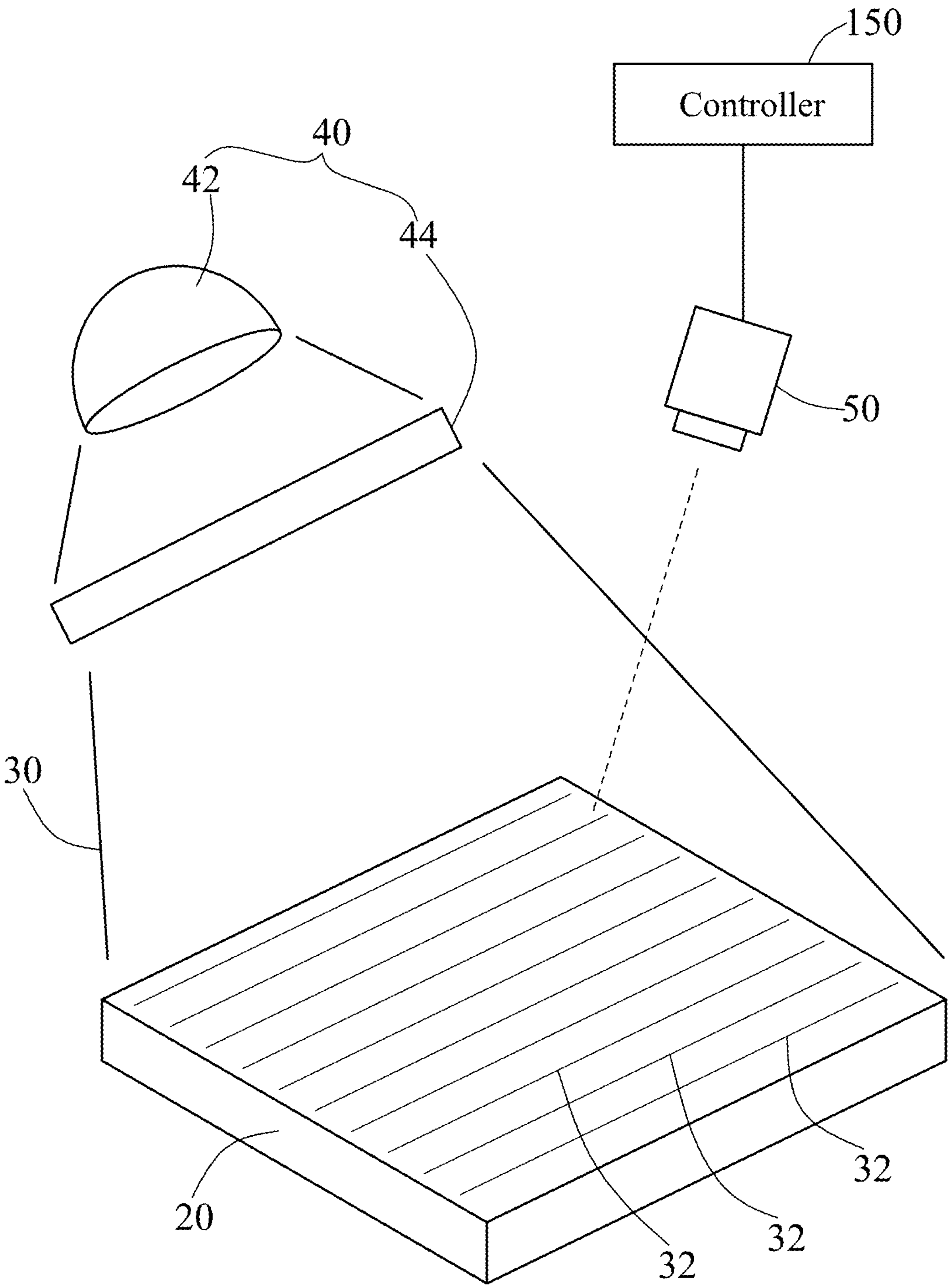
FIG. 4 is a schematic diagram illustrating structured light projected onto a photomask.

Please refer to FIG. 4. In one embodiment, after the wafer stage 110 is raised in step S140, it may be necessary to measure the deformation of the photomask 20. If the deformation exceeds a predetermined range, the controller 150 can operate the linear actuators 120 to adjust the wafer stage 110 so that the photomask 20's deformation is reduced below the threshold. Specifically, a structured light beam 30 is projected onto the surface of the photomask 20, forming multiple fringe patterns 32 on the photomask 20. The structured light 30 is generated by a structured light generator 40, which includes a light source 42 and a grating 44; the structured light 30 is formed by passing the light emitted from the light source 42 through the grating 44, creating a stripe-patterned structured light 30. Therefore, multiple fringe patterns 32 can form on the surface of the photomask 20. In addition to stripes, the structured light 30 may also form grid patterns or arrays of spots.

A capturing device 50 then detects changes in the fringe patterns 32 on the surface of the photomask 20 to determine whether the photomask 20 is deformed. Specifically, the capturing device 50 sends data regarding the fringe patterns 32 to the controller 150, which calculates the amount of deformation in the photomask 20 to determine if there is proper contact between the wafer 10 and the photomask 20. When the wafer 10 and the photomask 20 are not in good contact, the resulting deformation of photomask 20 will cause the fringe patterns 32 to deviate beyond a predetermined range. The controller 150 can then control the linear actuators 120 to finely adjust the height of the wafer stage 110 based on these fringe pattern changes, ensuring precise contact between the wafer 10 and the photomask 20 and thus maintaining exposure accuracy.

Although the present disclosure has been disclosed and illustrated with reference to particular embodiments, the principles involved are susceptible for use in numerous other embodiments that will be apparent to a person having ordinary skill in the art. This disclosure is, therefore, to be limited only as indicated by the scope of the appended claims.

What is claimed is:

1. A wafer stage lifting system for use in a contact lithography process, the wafer stage lifting system comprising:

a wafer stage configured to stably carry a wafer;

a plurality of linear actuators operatively connected to the wafer stage to facilitate vertical movement of the wafer stage, the linear actuators being arranged in a non-collinear manner;

a plurality of distance sensors respectively disposed to measure a plurality of measurement points on a surface of the wafer, each measurement point corresponding to one of the linear actuators;

a photomask stage configured to carry a photomask;

a controller operatively connected to the linear actuators and the distance sensors, the controller being configured to:

receive height measurement data from the distance sensors;

process the height measurement data to determine adjustments necessary to level the wafer stage;

calculate, based on the height measurement data, a distance between a surface of the wafer and the photomask; and control the linear actuators based on the processed height measurement data to adjust the position of the wafer stage so as to achieve contact between the wafer and the photomask;

a structured light generator configured to project structured light onto the photomask so as to generate a structured light pattern; and a capturing device configured to capture the structured light pattern on the photomask;

wherein the controller calculates deformation of the photomask based on changes in the structured light pattern, and further adjusts positions of the linear actuators according to the calculated photomask deformation so as to reduce deformation of the photomask.

2. The wafer stage lifting system of claim 1, wherein the plurality of linear actuators comprises three linear actuators arranged in a triangular configuration.

3. The wafer stage lifting system of claim 1, wherein each linear actuator includes a motor and a screw drive mechanism, the screw drive mechanism being one of a ball screw or a lead screw.

4. The wafer stage lifting system of claim 1, wherein the distance sensors are laser distance sensors.

5. A method of raising a wafer stage for use in a contact lithography process, the method comprising:

measuring, via a plurality of distance sensors, heights at a plurality of measurement points on a surface of a wafer;

processing the measured heights to determine height differences among the measurement points on the wafer surface;

adjusting positions of a plurality of linear actuators connected to the wafer stage, based on the determined height differences, so as to level the wafer stage, the plurality of linear actuators being arranged in a noncollinear manner;

calculating, based on the measured height data, a distance between the wafer surface and a photomask;

raising the wafer stage by the calculated distance so that the wafer contacts the photomask;

projecting structured light onto the photomask via a structured light generator to generate a structured light pattern;

capturing, by a capturing device, the structured light pattern on the photomask; and by a controller, calculating deformation of the photomask based on changes in the structured light pattern and further adjusting positions of the linear actuators according to the calculated photomask deformation so as to reduce the deformation of the photomask.

6. The method of raising a wafer stage of claim 5, further comprising evaluating the height measurement data to determine whether the wafer should be replaced based on the wafer surface flatness exceeding a predetermined threshold.

7. The method of raising a wafer stage of claim 5, further comprising retracting the distance sensors to a safe position after the wafer stage has been leveled.

8. The method of raising a wafer stage of claim 5, wherein the distance sensors are laser distance sensors.

* * * * *